(12) United States Patent
Zhu et al.

(10) Patent No.: US 10,614,281 B2
(45) Date of Patent: Apr. 7, 2020

(54) OPTICAL FINGERPRINT IMAGING SYSTEM AND ARRAY SENSOR

(71) Applicant: Shanghai Oxi Technology Co., Ltd, Shanghai (CN)

(72) Inventors: Hong Zhu, Shanghai (CN); Yan Ling, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 152 days.

(21) Appl. No.: 15/756,220

(22) PCT Filed: Sep. 15, 2015

(86) PCT No.: PCT/CN2015/089635
§ 371 (c)(1),
(2) Date: Feb. 28, 2018

(87) PCT Pub. No.: WO2017/045130
PCT Pub. Date: Mar. 23, 2017

(65) Prior Publication Data
US 2018/0247100 A1 Aug. 30, 2018

(51) Int. Cl.
*G06K 9/00* (2006.01)
*H01L 27/146* (2006.01)

(52) U.S. Cl.
CPC ...... *G06K 9/0004* (2013.01); *H01L 27/14623* (2013.01); *H01L 27/14678* (2013.01)

(58) Field of Classification Search
None
See application file for complete search history.

(56) References Cited

U.S. PATENT DOCUMENTS 5,726,443 A * 3/1998 Immega ............... G01S 17/026
250/208.1
2001/0050765 A1 12/2001 Antonelli et al.
(Continued)

FOREIGN PATENT DOCUMENTS

CN 1410940 A 4/2003
CN 101755284 A 6/2010
(Continued)

OTHER PUBLICATIONS

International Search Report and Written Opinion from PCT/CN2015/089635, dated Jun. 15, 2016.

*Primary Examiner* — Vu Le
*Assistant Examiner* — Tracy Mangialaschi
(74) *Attorney, Agent, or Firm* — Adsero IP (57) ABSTRACT

An optical fingerprint imaging system and an array sensor are provided. The optical fingerprint imaging system includes: a cover plate, a backlight source, an array sensor disposed between the cover plate and the backlight source, and an optical assembly; the array sensor includes an array of pixels each of which has an opaque region and a non-opaque region, the opaque region includes an photosensitive device for converting an input light into electronic signals, and the nonopaque region is adapted for allowing light from the backlight source passing through, and the optical assembly is adapted for partially blocking the light from the cover plate to the photosensitive device, and is configured with at least one light tunnel between the cover plate and each of the photosensitive devices, wherein the light tunnel allows light passing through in a preset range of direction. Accordingly, the contrast of a fingerprint image obtained is enhanced.

11 Claims, 7 Drawing Sheets

(56) References Cited

U.S. PATENT DOCUMENTS

| | | | |
|---|---|---|---|
| 2003/0062490 A1 | 4/2003 | Fujieda | |
| 2004/0252867 A1* | 12/2004 | Lan | G06K 9/0004 |
| | | | 382/124 |
| 2010/0142770 A1 | 6/2010 | Hayasaka et al. | |
| 2010/0165267 A1* | 7/2010 | Yoshida | G02F 1/13318 |
| | | | 349/106 |
| 2012/0321149 A1* | 12/2012 | Carver | G06K 9/0004 |
| | | | 382/124 |
| 2013/0120760 A1* | 5/2013 | Raguin | G01B 11/24 |
| | | | 356/612 |
| 2015/0371074 A1 | 12/2015 | Lin | |
| 2016/0132712 A1* | 5/2016 | Yang | G06K 9/0002 |
| | | | 348/77 |

FOREIGN PATENT DOCUMENTS

| | | |
|---|---|---|
| CN | 104318199 A | 1/2015 |
| CN | 204463158 U | 7/2015 |
| JP | 2005228191 A | 8/2005 |

\* cited by examiner

OPTICAL FINGERPRINT IMAGING SYSTEM AND ARRAY SENSOR

CROSS-REFERENCE TO RELATED APPLICATIONS

The present application is the national phase of International Application No. PCT/CN2015/089635, filed on Sep. 15, 2015, and entitled "OPTICAL FINGERPRINT IMAGING SYSTEM AND ARRAY SENSOR", the entire disclosure of which are incorporated herein by reference.

TECHNICAL FIELD

The present disclosure generally relates to optical imaging, and more particularly, to an optical fingerprint imaging system and an array sensor.

BACKGROUND

An optical fingerprint imaging system can implement fingerprint image capturing based on light reflection/refraction, and light sensing. Specifically, when a finger touches an active area of the optical fingerprint imaging system, light emitted from the fingerprint imaging system will reach the interface between the fingerprint imaging system and the finger, and be partially reflected at the interface. As light reflected at different regions of the interface, (e.g., where touched by ridge or valley of the finger) may have different intensities, features of a fingerprint corresponding to the finger can be represented based on the light intensity variations. In some solutions, the reflected light may be received by a sensor, then converted into electronic signals. As such, a fingerprint image can be obtained based on processing the electronic signals.

Figure 1:
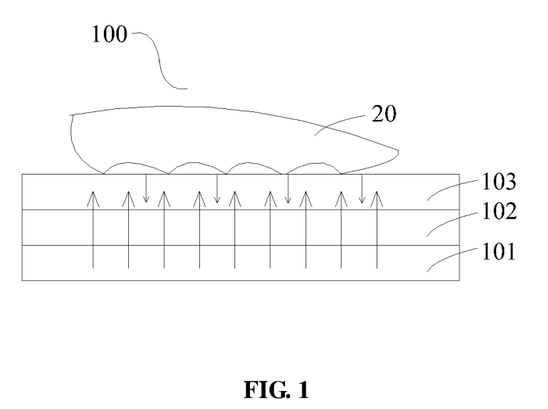
FIG. 1 schematically illustrates an existing optical fingerprint imaging system.

Referring to FIG. 1, an existing optical fingerprint imaging system 100 is illustrated. The optical fingerprint imaging system 100 includes a backlight source 101, an optical array sensor 102, and a cover plate 103. When a finger 20 touches the cover plate 103, light emitted from the backlight source 101 penetrates through the optical array sensor 102 and the cover plate 103, and reaches an interface between the finger 20 and the cover plate 103. Light reflection and refraction occur at the interface. The reflected light penetrates through the cover plate 103 and reaches the optical array sensor 102. The optical array sensor 102, including an array of pixels (e.g., photodiode or transistor), implements photo-electronic conversion to the received reflected light. Thus, electronic signals proportional to the intensity of the reflected light are obtained, based on which a fingerprint image of the finger 20 can be generated.

However, in existing optical fingerprint imaging systems, light reflected at a specific point of the interface may transmit in various directions, thus it may not only reach the corresponding pixel disposed right below the specific point of the interface, but also irradiate to the other neighboring pixels. As a result, the final obtained fingerprint image may be blurred.

Therefore, an optical fingerprint imaging system, which is able to obtain a fingerprint image in high contrast, is required.

SUMMARY

According to one embodiment of the present disclosure, an optical fingerprint imaging system is provided. The optical fingerprint imaging system includes: a cover plate which is nonopaque, a backlight source, an array sensor disposed between the cover plate and the backlight source, and an optical assembly; wherein the array sensor includes an array of pixels, the pixel of the array sensor has an opaque region and a nonopaque region, the opaque region includes an photosensitive device for converting an input light into electronic signals, and the nonopaque region is adapted for allowing light from the backlight source passing through; and wherein the optical assembly is adapted for partially blocking light from the cover plate to the photosensitive device, and is configured with at least one light tunnel between the cover plate and each of the photosensitive devices, wherein the light tunnel allows light passing through in a preset range of direction.

In some embodiments, the optical assembly includes a light shielding layer disposed between the array sensor and the cover plate; wherein the light shielding layer has at least a nonopaque hole corresponding to each of the photosensitive devices; and wherein the at least one nonopaque hole in the light shielding layer plays as the light tunnel.

In some embodiments, the nonopaque hole is empty or filled with nonopaque material.

In some embodiments, the light shielding layer has a nonopaque area corresponding to each of the pixel for allowing the light from the backlight source passing through.

In some embodiments, the nonopaque area of the light shielding layer is a set of holes which is empty or filled with nonopaque material.

In some embodiments, the light shielding layer has a multi-layer structure.

In some embodiments, the optical assembly is disposed between the array sensor and the cover plate; wherein the optical assembly includes at least two light shielding layers, and a nonopaque layer disposed between each two neighboring light shielding layers; wherein each of the light shielding layers has at least a nonopaque hole corresponding to each of the photosensitive devices, the nonopaque holes in different light shielding layers are at least partially overlapped; and wherein the nonopaque holes in the light shielding layers and the nonopaque layer inbetween form the light tunnel.

In some embodiments, the nonopaque hole is filled with the nonopaque layer or nonopaque material.

In some embodiments, each of the light shielding layers has a nonopaque area corresponding to each of the pixel for allowing the light from the backlight source passing through.

In some embodiments, the nonopaque area of the light shielding layer is a set of holes which is filled with the nonopaque layer or nonopaque material.

In some embodiments, the light shielding layer has a multi-layer structure.

In some embodiments, the nonopaque layer has a multi-layer structure.

In some embodiments, the photosensitive device is a photodiode.

In some embodiments, the photosensitive device is a photodiode; wherein a substrate of the array sensor serves as the cover plate, and the photodiode is formed on the substrate; wherein two metal layers and a nonopaque layer disposed inbetween are configured between the photodiode and the substrate; wherein each of the two metal layers has at least one nonopaque hole corresponding to each of the photodiodes, and the nonopaque holes in the two metal layers are at least partially overlapped; and wherein the nonopaque holes in the two metal layers and the nonopaque layer inbetween form the light tunnel.

In some embodiments, the two metal layers respectively serve as a driving line and a data line of the array sensor; and wherein the nonopaque layer serves as an insulating layer, which is made of silicon nitride or silicon oxide.

In some embodiments, the nonopaque hole in the metal layers is filled with the nonopaque layer or nonopaque material.

In some embodiments, the metal layer has a multi-layer structure.

In some embodiments, the nonopaque layer has a multi-layer structure.

Accordingly, in the optical fingerprint imaging system, at least one light tunnel is configured between each photosensitive device (e.g., photodiode) and the cover plate. Thus, only light within a preset range of direction can pass through the light tunnel and reach the photosensitive device. Therefore, light reflected by the fingerprint above other pixels, which is out of the preset range of direction, can be prevented from reaching the photosensitive device. As such, interferences between neighboring pixels are eliminated, and the contrast of the fingerprint image obtained by the optical fingerprint imaging system is enhanced.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Figure 2:
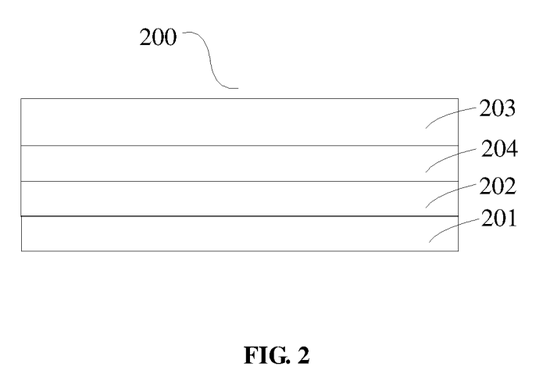
FIG. 2 schematically illustrates an optical fingerprint imaging system according to one embodiment of the present disclosure.
Figure 3:
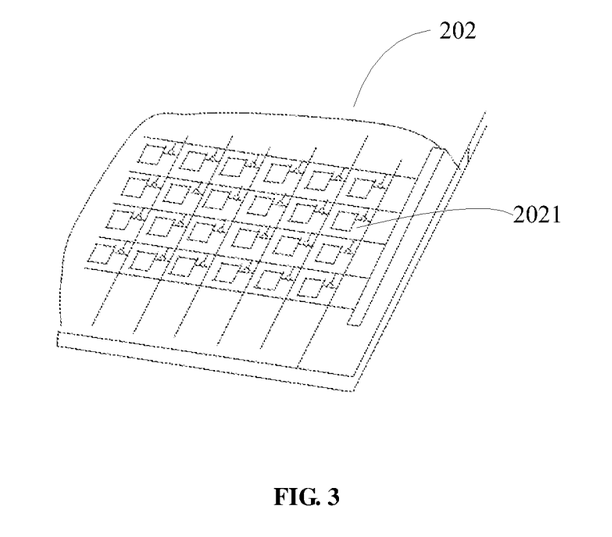
FIG. 3 schematically illustrates an array sensor of an optical fingerprint imaging system according to one embodiment of the present disclosure.

Referring to FIG. 2 and FIG. 3, an optical fingerprint imaging system 200 according to one embodiment of the present disclosure is illustrated. The optical fingerprint imaging system 200 includes a backlight source 201, an array sensor 202, and a cover plate 203 which is nonopaque, wherein the array sensor 202 is disposed between the backlight source 201 and the cover plate 203.

The array sensor 202 includes an array of pixels 2021, the pixel 2021 of the array sensor 202 has an opaque region and a nonopaque region, the opaque region includes a photosensitive device (not labeled in FIG. 2 and FIG. 3) for converting an input light into electronic signals, and the nonopaque region is adapted for allowing light from the backlight source 201 passing through. Accordingly, an incident light emitted from the backlight source 201 is adapted to penetrate through the nonopaque regions of the pixels 2021, and the cover plate 203, thus reaching an interface between the cover plate 203 and a finger on the cover plate 203. The incident light is partially reflected at the interface, thus obtaining a reflected light. The reflected light (i.e. the input light) then reaches the photosensitive devices of the pixels 2021 where photo-electronic conversion is implemented, to obtain electronic signals corresponding to the reflected light. Thereafter, the obtained electronic signals can be further processed to generate a fingerprint image of the finger.

Accordingly, when implementing a fingerprint imaging process, light emitted from the backlight source 201 penetrates through the nonopaque regions of the pixels 2021 and reaches an interface between the cover plate 203 and a finger in contact with the cover plate 203. Light reflected by the interface reaches the pixels 2021 of the optical array sensor 202 where photo-electronic conversion is implemented, thus a fingerprint image of the finger is obtained.

The optical fingerprint imaging system 200 further includes an optical assembly 204 disposed between the cover plate 203 and the optical array sensor 202. The optical assembly 204 is adapted for partially blocking the light from the cover plate 203 (i.e. the reflected light) to the photosensitive devices of the array sensor 202.

Specifically, the optical assembly 204 is configured with at least one light tunnel (not shown in FIG. 2 and FIG. 3) between the cover plate 203 and each of the photosensitive devices, wherein the light tunnel is configured to allow light passing through in a preset range of direction. As such, light reflected by the fingerprint above other pixels, which is out of the preset range of direction, can be prevented from passing through. Therefore, interferences between different pixels are eliminated, and a contrast of a fingerprint image obtained by the optical fingerprint imaging system is enhanced.

Figure 4:
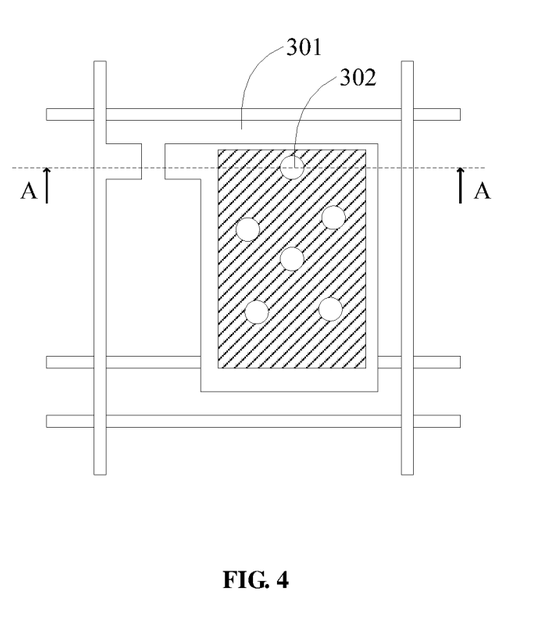
FIG. 4 schematically illustrates a top view of a pixel configured with light tunnels according to one embodiment of the present disclosure.
Figure 5:
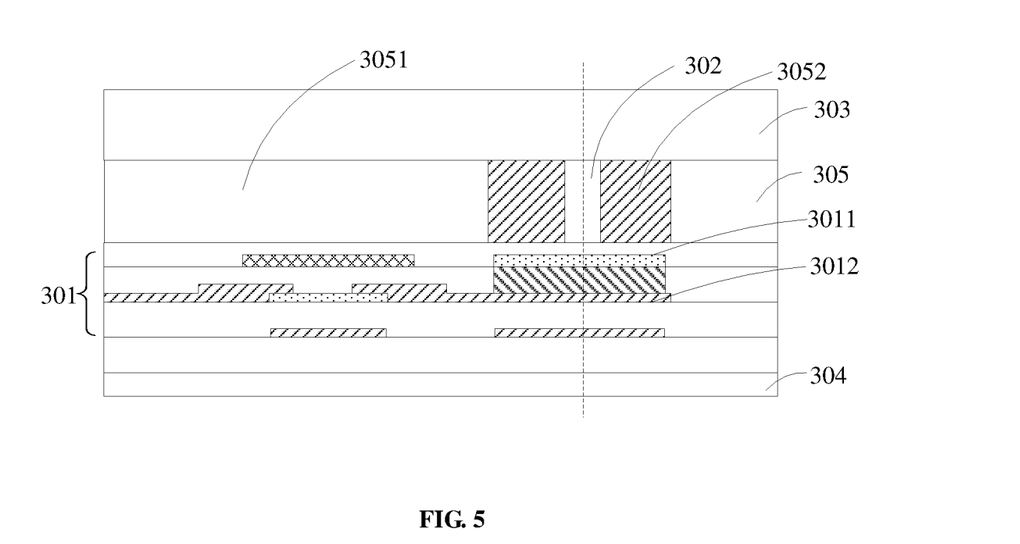
FIG. 5 schematically illustrates a cross sectional view of a pixel configured with a light tunnel along line A-A shown in FIG. 4.

Referring to FIG. 4 and FIG. 5, a pixel 301 configured with light tunnels 302 according to one embodiment of the present disclosure is illustrated. The pixel 301 includes a photosensitive device (not labeled in FIG. 4 and FIG. 5). The photosensitive device has a first surface 3011 and a second surface 3012 opposite to the first surface 3011. The first surface 3011 is a nonopaque surface and is disposed facing a cover plate 303. The second surface 3012 is an opaque surface and is disposed facing a backlight source 304. In other words, the photosensitive device is adapted to convert input light penetrating through the first surface 3011 thereof into electronic signals, and prevent light from the backlight source 304 from penetrating through the second surface 3012 into the photosensitive device.

In some embodiments of the present disclosure, the photosensitive device is a photodiode, the first surface 3011 is a surface of a positive electrode pad, and the second surface 3012 is a surface of a negative electrode pad. Or, the first surface 3011 is a surface of a negative electrode pad, and the second surface 3012 is a surface of a positive electrode pad.

As shown in FIG. 5, the light tunnel 302 is configured in a light shielding layer 305. Specifically, the light shielding layer 305 is disposed between the first surface 3011 of the photosensitive device and the cover plate 303. In some embodiments, the light tunnel 302 is a nonopaque hole formed in the light shielding layer 305. In some embodiments, the nonopaque hole is empty. In some embodiments, the nonopaque hole is filled with nonopaque material, which is configured by forming a through hole in the light shielding layer 305, and filling the through hole with nonopaque material. In some embodiments of the present disclosure, the nonopaque material is silicon nitride, silicon oxide, nonopaque plastic, or nonopaque organic membrane.

The light shielding layer 305 has an opaque area 3052 which is made of opaque material that adapted to prevent light from passing through. In some embodiments, the opaque area 3052 is made of metal, opaque organic membrane, opaque plastic, or silicon.

In some embodiments of the present disclosure, the light shielding layer 305 may have a multi-layer structure.

It should be noted that, in FIG. 5, only portion of the opaque area 3052 where the light tunnel 302 is formed, is shown. It can be understood that, a shape of the opaque area 3052 is not limited by the present disclosure, as long as light transmitting from the cover plate 303 can be partially blocked and prevented from reaching the corresponding photosensitive device.

Keep referring to FIG. 5, the light shielding layer 305 further has a nonopaque area 3051 corresponding to the pixel 301. Thus, light emitted from the backlight source 304 can penetrate through the nonopaque region of the pixel 301, and the nonopaque area 3051 of the light shielding layer 305, thus reaching the cover plate 303.

It should be noted that, in FIG. 5, only a cross-section of the nonopaque area 3051 is shown, a shape or a form of the nonopaque area 3051 may be various, which is not limited by the present disclosure as long as light emitted from the backlight source 304 is adapted to pass through. In some embodiments, the nonopaque area 3051 may include a set of holes which is empty or filled with nonopaque material.

Accordingly, when implementing a fingerprint image capturing process, an incident light emitted from the backlight source 304 penetrates through the nonopaque regions of the pixels 301, the nonopaque area 3051 and the cover plate 303, thus being partially reflected at an interface between the cover plate 303 and a finger on the cover plate 303 to obtain a reflected light. The reflected light (i.e. an input light) is reflected to the first surface 3011 of the photosensitive device, then into the photosensitive device. As the opaque area 3052 and the light tunnel 302 are configured above the first surface 3011 of photosensitive device, only light within a preset range of direction is allowed passing through the light tunnel 302 and reaching the first surface 3011 of photosensitive device. In other words, only light within the preset range of direction is used for generating a fingerprint image of the finger.

It should be noted that, the preset range of direction refers to a range of angles with respect to an axis perpendicular to the pixel 301 (as indicated by dotted line in FIG. 5). The preset range of direction is determined by a dimension of the light tunnel 302, such as a sectional dimension of the light tunnel 302, and a depth of the light tunnel 302. It should be noted that, the sectional dimension of the light tunnel 302 refers to a size of a projection of the light tunnel 302 on a plane perpendicular to the axis. The depth of the light tunnel 302 refers to a size of the light tunnel 302 along the axis. In some embodiments, as shown in FIG. 4 and FIG. 5, the light tunnel 302 is configured having a circular cross section. In some embodiment, the light tunnel 302 may be configured having a rectangle cross section. Accordingly, the preset range of direction is determined by a width to depth ratio of the light tunnel 302. The width refers to a size of the light tunnel along a direction perpendicular to the axis, such as a diameter of the circular cross section, or a side length of the rectangle cross section. Specifically, the preset range of direction enlarges with increase of the width to depth ratio of the light tunnel 302, and shrinks with the decrease of the width to depth ratio of the light tunnel 302.

Accordingly, the light tunnel 302 can be configured to allow light substantially perpendicular to the pixel 301 passing through by adjusting the sectional dimension and the depth thereof. Therefore, light reflected by a fingerprint over one pixel is prevented from passing through the light tunnels over other pixels, thus reaching to first surfaces of photosensitive devices in other pixels. By such way, interferences between pixels are eliminated, and a contrast of the fingerprint image generated is enhanced.

Figure 6:
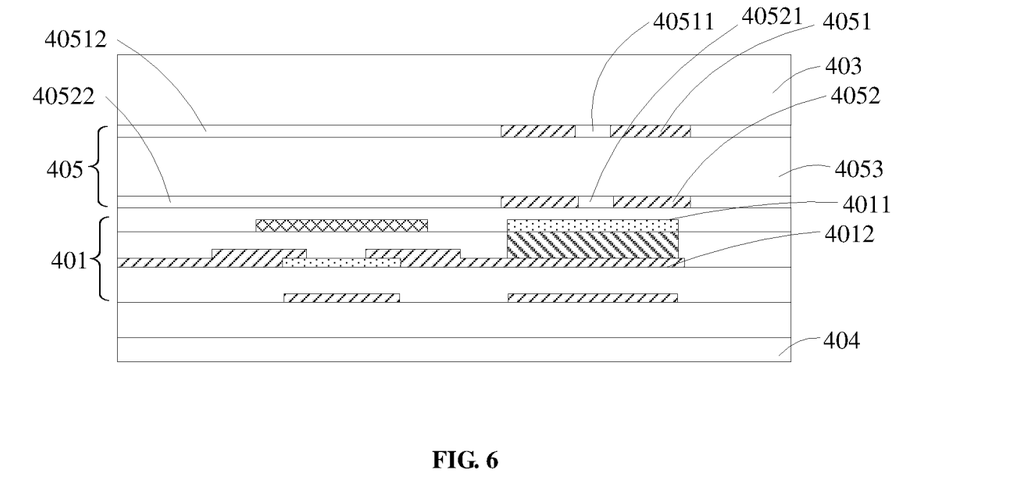
FIG. 6 schematically illustrates a cross sectional view of a pixel configured with a light tunnel according to another embodiment of the present disclosure.

Referring to FIG. 6, a pixel 401 configured with a light tunnel (not labeled in FIG. 6) according to another embodiment of the present disclosure is illustrated. The pixel 401 includes a photosensitive device (not labeled in FIG. 6). The photosensitive device has a first surface 4011 and a second surface 4012 opposite to the first surface 4011. The first surface 4011 is a nonopaque surface and is disposed facing a cover plate 403. The second surface 4012 is an opaque surface and is disposed facing a backlight source 404. In other words, the photosensitive device is adapted to convert input light penetrating through the first surface 4011 into electronic signals, and prevent light from the backlight source 404 penetrating through the second surface 4012 into the photosensitive device.

The light tunnel is formed in a stacked structure 405. The stacked structure 405 includes two light shielding layers and a nonopaque layer 4053 disposed inbetween, wherein the two light shielding layers are respectively the first light shielding layer 4051 and the second light shielding layer 4052. The first light shielding layer 4051 includes a first nonopaque hole 40511, and the second light shielding layer 4052 includes a second nonopaque hole 40521. The first nonopaque hole 40511 and the second nonopaque hole 40521 are at least partially overlapped along a direction perpendicular to the pixel 401. In other words, projections of the first nonopaque hole 40511 and the second nonopaque hole 40521 on the pixel 401 along the direction perpendicular to the pixel 401 are at least partially overlapped. The first nonopaque hole 40511, the second nonopaque hole 40521, and the nonopaque layer 4053 inbetween form the light tunnel.

Accordingly, the light tunnel can be configured to allow light passing through in a preset range of direction and reaching the first surface 4011 of the photosensitive device. Therefore, interferences between different pixels are eliminated, and performance of the fingerprint imaging system is enhanced.

In some embodiments of the present disclosure, the first nonopaque hole 40511 and the second nonopaque hole 40521 are filled with nonopaque material. In some embodiments of the present disclosure, the light tunnel is filled with the nonopaque layer 4053. In other words, the first nonopaque hole 40511 and the second nonopaque hole 40521 are formed in a same process or a same set of processes with the nonopaque layer 4053. It should be noted that, the material of the light tunnel is not limited by the present disclosure, as long as a light can pass through.

As shown in FIG. 6, the first light shielding layer 4051 further has a nonopaque area 40512 corresponding to the pixel 401, and the second light shielding layer 4052 further has a nonopaque area 40522. Thus, light from the backlight source 404 can penetrate through the nonopaque region of the pixel 401, the nonopaque area 40522 of the second light shielding 4052, the nonopaque area 40512 of the first light shielding 4051, thus reaching the cover plate 403. It should be noted that, only a cross-section of the nonopaque areas 40512 and 40522 is shown, a shape or a form of them may various, which are not limited by the present disclosure as long as light emitted from the backlight source 404 is adapted to pass through.

In some embodiments, the nonopaque area 40512 and the nonopaque area 40522 are both filled with nonopaque material. In some embodiments of the present disclosure, the nonopaque area 40512 and the nonopaque area 40522 are both filled with the nonopaque layer 4053. In other words, the nonopaque area 40512 of the first light shielding layer 4051, the nonopaque area 40522 of the second light shielding layer 4052, and the nonopaque layer 4053 are configured into an integral structure and formed by a same process or a same set of processes.

In some embodiments of the present disclosure, the light shielding layers (i.e. the first light shielding layer 4051 and the second light shielding layer 4052) have a multi-layer structure. In some embodiments of the present disclosure, the nonopaque layer 4053 has a multi-layer structure.

Figure 7:
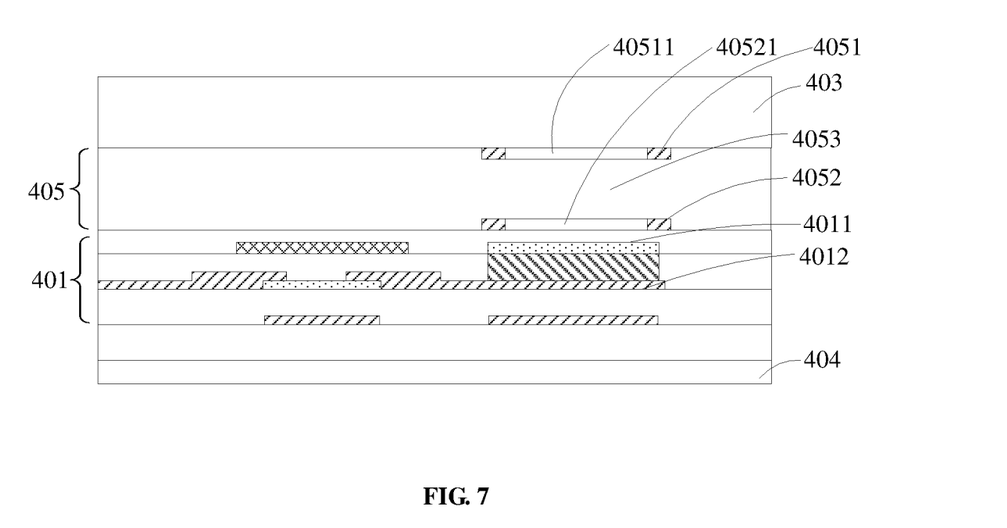
FIG. 7 schematically illustrates a cross sectional view of a pixel configured with a light tunnel according to another embodiment of the present disclosure.

As shown in FIG. 7, in some embodiments of the present disclosure, a width of the light tunnel is increased in comparison with that shown in FIG. 6. As a result, a preset range of direction, within which light can be allowed passing through and reaching the first surface 4011 of the photosensitive device, is enlarged. Thus, more light can reach the photosensitive device, thus being used for implementing a fingerprint image capturing in higher sensitivity.

Figure 8:
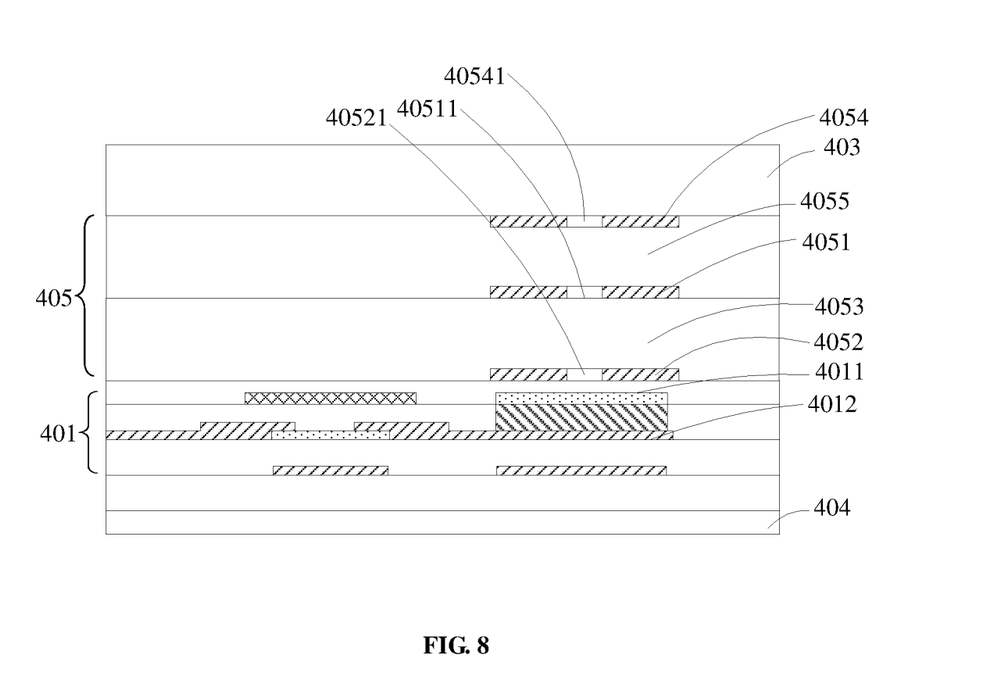
FIG. 8 schematically illustrates a cross sectional view of a pixel configured with a light tunnel according to another embodiment of the present disclosure.

In some embodiments of the present disclosure, referring to FIG. 8, the stacked structure 405, where the light tunnel is formed, further includes a third light shielding layer 4054 and a second nonopaque layer 4055. The third light shielding layer 4054 is disposed between the first light shielding layer 4051 and the cover plate 403, and the second nonopaque layer 4055 is disposed between the first light shielding layer 4051 and the third light shielding layer 4054. In other words, the stacked structure 405 includes three light shielding layers (the first light shielding layer 4051, the second light shielding layer 4052, and the third light shielding layer 4054), and two nonopaque layers (the first nonopaque layer 4053 and the second nonopaque layer 4055) respectively disposed between two neighboring light shielding layers. It should be noted that, two neighboring light shielding layers as recited herein refer to two light shielding layers which have no light shielding layer disposed inbetween.

The third light shielding layer 4054 is configured with a third nonopaque hole 40541. The first nonopaque hole 40511, the second nonopaque hole 40521, and the third nonopaque hole 40541 are at least partially overlapped along a direction perpendicular to the pixel 401. The first nonopaque hole 40511, the second nonopaque hole 40521, the third nonopaque hole 40541, and the first nonopaque layer 4053 the second nonopaque layer 4055 correspondingly inbetween form the light tunnel.

It should be noted that, in some embodiments of the present disclosure, the stacked structure 405 may include: more than three light shielding layers each of which is configured with a nonopaque hole, and a nonopaque layer between each two neighboring light shielding layers. In other words, multiple light shielding layers and multiple nonopaque layers are alternately arranged. The nonopaque holes and the nonopaque layers inbetween serve as the light tunnel.

Figure 9:
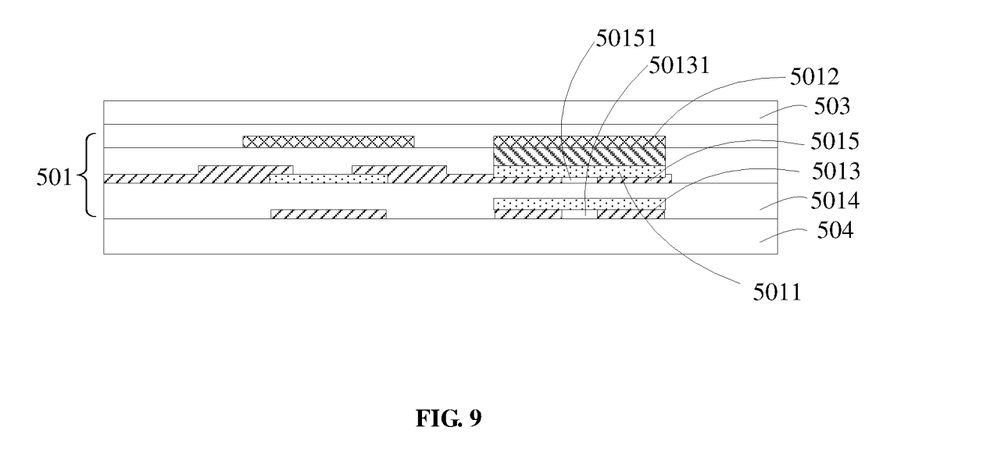
FIG. 9 schematically illustrates a cross sectional view of a pixel configured with a light tunnel according to another embodiment of the present disclosure.

Referring to FIG. 9, a pixel 501 configured with a light tunnel (not labeled in FIG. 9) according to another embodiment of the present disclosure is illustrated. The pixel 501 includes a photosensitive device (not labeled in FIG. 9).

The photosensitive device is a photodiode. The photodiode has a first electrical pad 5011 and a second electrical pad 5012 opposite to the first electrical pad 5011, wherein the first electrical pad 5011 is nonopaque while the second electrical pad 5012 is opaque. Further, a semiconductor layer is disposed between the first electrical pad 5011 and the second electrical pad 5012. The photodiode is adapted to convert light penetrating through the first electrical pad 5011 into electronic signals.

Moreover, a substrate 504 of the array sensor serves as a cover plate, and a backlight source 503 is placed on a top surface of the array sensor. The top surface of the array sensor refers to a surface of the array sensor opposite to the substrate 504. Furthermore, the pixel 501 is formed on the substrate 504. Specifically, a first metal layer 5013 of the pixel 501 is disposed on the substrate 504, a nonopaque layer 5014 is disposed on the first metal layer 5013, and a second metal layer 5015 is disposed on the nonopaque layer 5014. Further, the first electrical pad 5011 of the photodiode is disposed facing the second metal layer 5015. The first metal layer 5013 serves as a driving line while the second metal layer 5015 serves as a data line, or the first metal layer 5013 serves as a data line while the second metal layer 5015 serves as a driving line. The nonopaque layer 5014 serves as an insulating layer, which is made of silicon nitride or silicon oxide.

Each of the metal layers (i.e. the first metal layer 5013 and the second metal layer 5015) has at least one nonopaque hole corresponding to the photodiode, and the nonopaque holes in different metal layers are at least partially overlapped, wherein the nonopaque holes in the metal layers and the nonopaque layer inbetween form the light tunnel. Specifically, as shown in FIG. 9, the first metal layer 5013 has a first nonopaque hole 50131, and the second metal layer 5015 has a second nonopaque hole 50151, wherein the first nonopaque hole 50131 and the second nonopaque hole 50151 are at least partially overlapped. The first nonopaque holes 50131, the second nonopaque hole 50151, and the nonopaque layer 5014 inbetween form the light tunnel. Accordingly, the light tunnel is configured in existing layers of the pixel, thus no additional layer is required. Therefore, performance of a fingerprint imaging system configured with the pixel 501 as illustrated above is improved without increasing a dimension thereof.

In order to decrease the preset range of direction, within which light is allowed passing through, thus improving the performance of the fingerprint imaging system, the depth of the light tunnel is required to be increased. The depth of the light tunnel can be increased by increasing a thickness of the nonopaque layer 5014. However, manufacturing complexity and cost are increased with the increase of the thickness of the nonopaque layer 5014. Therefore, in some embodiments of the present disclosure, the light tunnel further includes a third nonopaque hole, so as to increase the thickness of the light tunnel without increasing the manufacturing complexity and the cost thereof.

Figure 10:
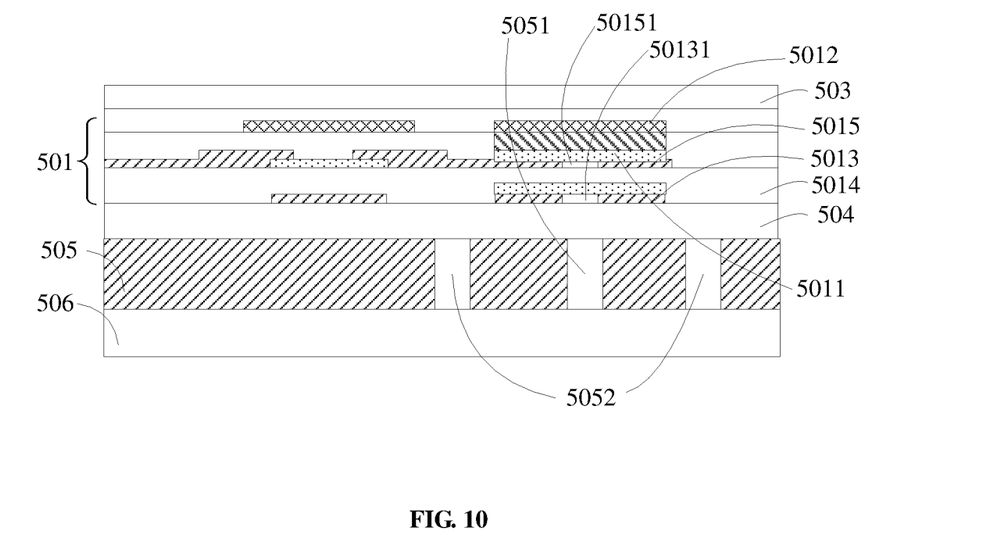
FIG. 10 schematically illustrates a cross sectional view of a pixel configured with a light tunnel according to another embodiment of the present disclosure.

Specifically, as shown in FIG. 10, the light tunnel (not labeled in FIG. 10) further includes a third nonopaque hole 5051. The third nonopaque hole 5051 is configured on a light shielding layer 505. The light shielding layer 505 is disposed between the substrate 504 and a cover plate 506. The first nonopaque hole 50131, the second nonopaque hole 50151, and the third nonopaque hole 5051 are partially overlapped along a direction perpendicular to the pixel 501.

Accordingly, the depth of the light tunnel is increased, thus the preset range of direction, within which light is allowed passing through, is reduced. Therefore, the light tunnel can be configured to allow light substantially perpendicular to the pixel 501 passing through and reaching the first surface 5011 of the photosensitive device.

Furthermore, as shown in FIG. 10, the light shielding layer 505 further has a nonopaque area 5052 corresponding to the pixel 501. The nonopaque area 5052 is configured into a set of holes which is empty or filled with nonopaque material. Accordingly, light emitted from the backlight source 503 can penetrate through the nonopaque region of the pixel 501, the substrate 504 of the array sensor, the nonopaque area 5052 of the light shielding 505, thus reaching the cover plate 506. It should be noted that, only a cross-section of the nonopaque area 5052 is shown, a shape or a form of the nonopaque area 5052 may various, which is not limited by the present disclosure as long as light emitted from the backlight source 503 is adapted to pass through.

Figure 11:
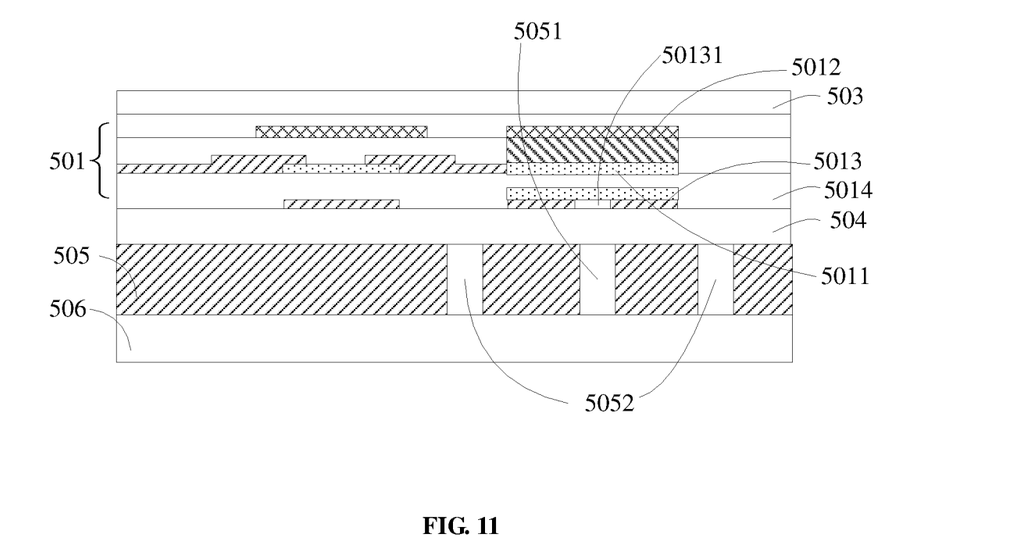
FIG. 11 schematically illustrates a cross sectional view of a pixel configured with a light tunnel according to another embodiment of the present disclosure.
Figure 12:
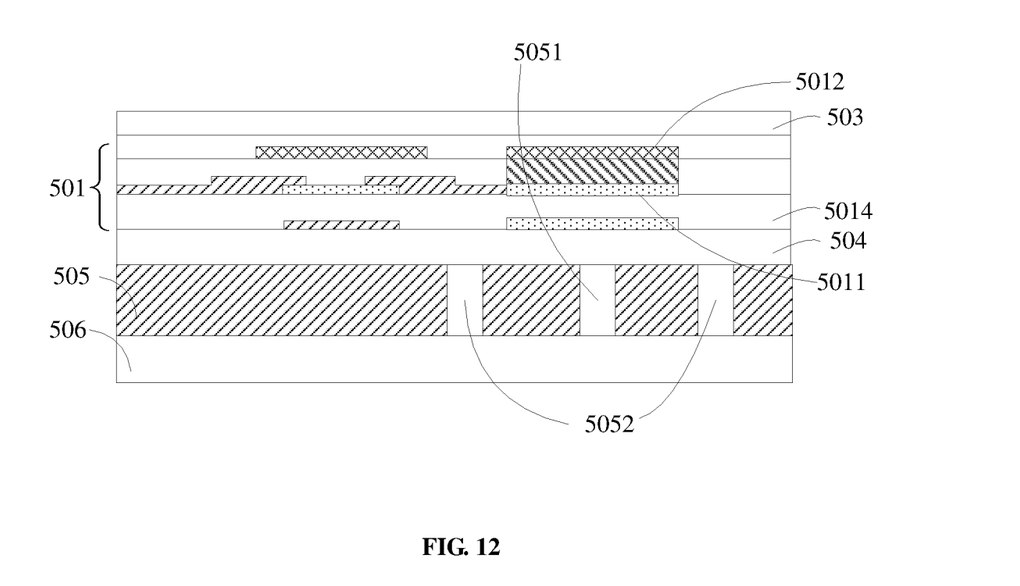
FIG. 12 schematically illustrates a cross sectional view of a pixel configured with a light tunnel according to another embodiment of the present disclosure.

As the configuration of the light shielding layer 505 which is formed with the third nonopaque hole 5051 thereon, and the thickness of the light shielding layer 505 can be increased, the second metal layer 5015 and the second nonopaque hole 50151 can be removed, as shown in FIG. 11. Furthermore, the first metal layer 5013 and the first nonopaque hole 50131 can be removed as well, as shown in FIG. 12. Accordingly, a planeness of the pixel is improved, and a manufacturing process thereof is simplified as well.

Figure 13:
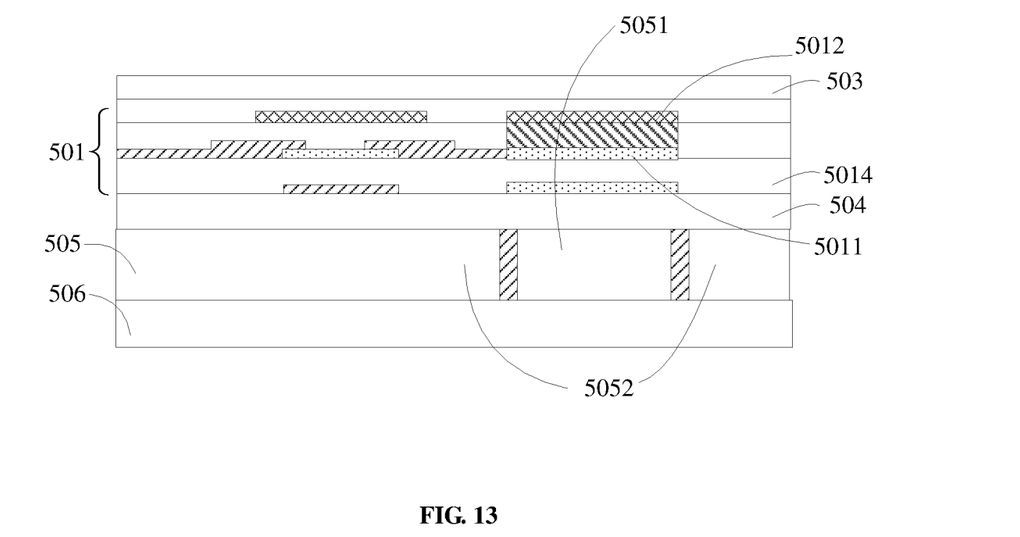
FIG. 13 schematically illustrates a cross sectional view of a pixel configured with a light tunnel according to another embodiment of the present disclosure.

In some embodiments of the present disclosure, as shown in FIG. 13, the sectional dimension of the light tunnel (not labeled in FIG. 13) is enlarged. Therefore, more light can reach the photosensitive device, thus being used for implementing a fingerprint image capturing in higher sensitivity.

Figure 14:
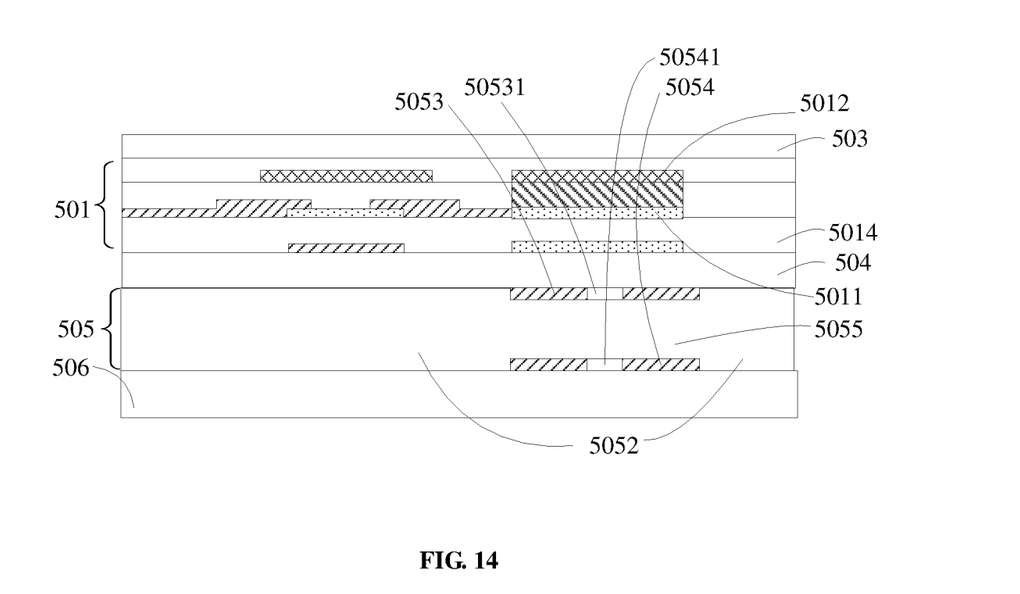
FIG. 14 schematically illustrates a cross sectional view of a pixel configured with a light tunnel according to another embodiment of the present disclosure.

In some embodiments of the present disclosure, as shown in FIG. 14, the light tunnel (not labeled in FIG. 14) is configured in a stacked structure 505. The stacked structure 505 includes two light shielding layers, which are respectively a first light shielding layer 5053 and a second light shielding layer 5054, and a nonopaque layer 5055 disposed between the first light shielding layer 5053 and the second light shielding layer 5054. The first light shielding layer 5053 includes a first nonopaque hole 50531, and the second light shielding layer 5054 includes a second nonopaque hole 50541. The first nonopaque hole 50531 and the second nonopaque hole 50541 are at least partially overlapped along a direction perpendicular to the pixel 501. In other words, projections of the first nonopaque hole 50531 and the second nonopaque hole 50541 on the pixel 501 along the direction perpendicular to the pixel 501 are at least partially overlapped. The first nonopaque hole 50531, the second nonopaque hole 50541, and the nonopaque layer 5055 inbetween form the light tunnel.

In some embodiments, the stacked structure 505 includes: more than two light shielding layers each of which is configured with a nonopaque hole, and a nonopaque layer between each two neighboring light shielding layers. The nonopaque holes and the nonopaque layers inbetween form the light tunnel.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. An optical fingerprint imaging system, comprising: a cover plate which is nonopaque, a backlight source, an array sensor disposed between the cover plate and the backlight source, and an optical assembly disposed between the array sensor and the cover plate;
    wherein the array sensor comprises an array of pixels, each pixel of the array sensor has an opaque region and a nonopaque region, the opaque region comprises a photosensitive device for converting an input light into electronic signals, and the nonopaque region is adapted for allowing light from the backlight source passing through;
    wherein the optical assembly is adapted for partially blocking light from the cover plate to the photosensitive device, and is configured with at least one light tunnel between the cover plate and each of the photosensitive devices, wherein the light tunnel allows light passing through in a preset range of directions;
    wherein the optical assembly comprises at least two light shielding layers and a nonopaque layer disposed between each two neighboring light shielding layers, each of the at least two light shielding layers is configured with at least one nonopaque hole, and the nonopaque holes in the at least two light shielding layers and the nonopaque layer in between form the light tunnel;
    wherein the photosensitive device is a photodiode;
    wherein the photodiode is formed on a substrate of the array sensor;
    wherein the at least two light shielding layers comprise two metal layers formed between the photodiode and the substrate, the nonopaque layer is disposed between the two metal layers;
    wherein each of the two meal layers is configured with the at least one nonopaque hole corresponding to each of the photodiodes, and the nonopaque holes in the two metal layers are at least partially overlapped; and
    wherein the nonopaque holes in the two metal layers and the nonopaque layer inbetween form the light tunnel.

2. The optical fingerprint imaging system according to claim 1, wherein the at least one nonopaque hole corresponds to each of the photosensitive devices, and the nonopaque holes in different light shielding layers are at least partially overlapped.

3. The optical fingerprint imaging system according to claim 1, wherein the at least one nonopaque hole is filled with the nonopaque layer or nonopaque material.

4. The optical fingerprint imaging system according to claim 1, wherein at least one of the at least two light shielding layers comprises a nonopaque area corresponding to each of the pixels for allowing the light from the backlight source passing through.

5. The optical fingerprint imaging system according to claim 4, wherein the nonopaque area comprises a set of holes which are empty or are filled with the nonopaque layer or nonopaque material.

6. The optical fingerprint imaging system according to claim 1, wherein at least one of the at least two light shielding layers has a multi-layer structure; and/or the nonopaque layer has a multi-layer structure.

7. The optical fingerprint imaging system according to claim 1, wherein the two metal layers respectively serve as a driving line and a data line of the array sensor; and wherein the nonopaque layer serves as an insulating layer, which is made of silicon nitride or silicon oxide.

8. The optical fingerprint imaging system according to claim 1, wherein the at least one nonopaque hole in the each of the two metal layers is filled with the nonopaque layer or nonopaque material.

9. The optical fingerprint imaging system according to claim 1, wherein at least one of the two metal layers has a multi-layer structure; and/or the nonopaque layer has a multi-layer structure.

10. The optical fingerprint imaging system according to claim 1, wherein the optical fingerprint imaging system further comprises a light shielding layer disposed between the substrate and the cover plate and configured with at least one nonopaque hole corresponding to each of the photodiodes, and the nonopaque holes in the two metal layers and the light shielding layer between the substrate and the cover plate are at least partially overlapped.

11. The optical fingerprint imaging system according to claim 10, wherein the light shielding layer between the substrate and the cover plate is configured with at least one nonopaque area.

* * * * *